(12) United States Patent
Mizukami et al.

(10) Patent No.: US 8,648,447 B2
(45) Date of Patent: Feb. 11, 2014

(54) SEMICONDUCTOR RECTIFIER DEVICE

(75) Inventors: Makoto Mizukami, Kanagawa (JP); Masamu Kamaga, Tokyo (JP); Kazuto Takao, Ibaraki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 13/409,820

(22) Filed: Mar. 1, 2012

(65) Prior Publication Data
US 2012/0228635 A1    Sep. 13, 2012

(30) Foreign Application Priority Data

Mar. 10, 2011  (JP) .................................. 2011-052785
Feb. 28, 2012  (JP) .................................. 2012-042375

(51) Int. Cl.
*H01L 29/868* (2006.01)

(52) U.S. Cl.
USPC 257/656; 257/77; 257/E29.104; 257/E29.336

(58) Field of Classification Search
USPC ...................... 257/77, 656, E29.104, E29.336
See application file for complete search history.

(56) References Cited

U.S. PATENT DOCUMENTS

| | | | | |
|---|---|---|---|---|
| 4,410,902 A * | 10/1983 | Malik | ............................. | 257/498 |
| 4,784,702 A * | 11/1988 | Henri | ............................. | 136/258 |
| 5,942,788 A * | 8/1999 | Takada et al. | ................. | 257/438 |
| 6,635,899 B2 * | 10/2003 | Saito et al. | ....................... | 257/64 |
| 6,734,462 B1 * | 5/2004 | Shah | ................................ | 257/77 |
| 8,174,089 B2 * | 5/2012 | Flynn et al. | .................... | 257/453 |
| 2007/0096239 A1 * | 5/2007 | Cao et al. | ....................... | 257/458 |
| 2007/0187693 A1 * | 8/2007 | Kobayakawa et al. | ........... | 257/76 |
| 2008/0217627 A1 * | 9/2008 | Friedrichs et al. | ............... | 257/77 |

FOREIGN PATENT DOCUMENTS

| | | |
|---|---|---|
| JP | 2000-516402 | 12/2000 |
| JP | 2010-92991 | 4/2010 |
| WO | WO 98/08259 | 2/1998 |

* cited by examiner

*Primary Examiner* — Steven J Fulk
(74) *Attorney, Agent, or Firm* — Oblon, Spivak, McClelland, Maier & Neustadt, L.L.P.

(57) ABSTRACT

A semiconductor rectifier device using an SiC semiconductor at least includes: an anode electrode; an anode area that adjoins the anode electrode and is made of a second conductivity type semiconductor; a drift layer that adjoins the anode area and is made of a first conductivity type semiconductor having a low concentration; a minority carrier absorption layer that adjoins the drift layer and is made of a first conductivity type semiconductor having a higher concentration than that of the drift layer; a high-resistance semiconductor area that adjoins the minority carrier absorption layer, has less thickness than the drift layer and is made of a first conductivity type semiconductor having a concentration lower than that of the minority carrier absorption layer; a cathode contact layer that adjoins the semiconductor area; and a cathode electrode.

24 Claims, 7 Drawing Sheets

SEMICONDUCTOR RECTIFIER DEVICE

CROSS-REFERENCE TO RELATED APPLICATION

This application is based upon and claims the benefit of priority from the prior Japanese Patent applications No. 2011-052785, filed on Mar. 10, 2011, and No. 2012-042375, filed on Feb. 28, 2012; the entire contents of which are incorporated herein by reference.

FIELD

Embodiments described herein relate to a semiconductor rectifier device such as a wide bandgap semiconductor PiN diode device.

BACKGROUND

In wide bandgap semiconductors such as SiC, a thickness of a drift layer for providing a certain withstanding voltage can be reduced due to its physical property. As a result, since the resistance of the drift layer can be suppressed to a low level, semiconductor devices having a low electrical loss are expected to be obtained.

Generally, a PiN diode has a p-n junction. When a forward bias is applied thereto, energy of the minority carriers exceeds the p-n junction energy, conductivity change is generated by the minority carriers, and the resistance can be lowered. In addition, as the temperature of the device increases, the energy of the minority carriers exceeding the p-n junction increases so that they can easily exceed the junction. For this reason, the voltage at the rising-edge of the I-V curve is lowered as the temperature increases.

In the case of a PiN diode using Si and having a high withstanding voltage, the thickness of the drift layer is large. Therefore, as the temperature increases, the resistance of the thick drift layer increases. Therefore, the lowered amount of the voltage at the rising-edge is offset by the increased amount of the resistance in the drift layer. Accordingly, the on-voltage in the requirement current in the vicinity of the operational temperature increases as the temperature increases.

As a result, even when diodes are used in parallel with each other in a circuit, and the electric current is concentrated on a certain device, the temperature of that device increases, and the resistance also increases, so that it is possible to alleviate the current concentration, and spontaneously suppress breakdown.

In the case of SiC, the reduction of the rising-edge voltage accompanied by the increased temperature is generated similarly to a typical Si diode. However, since the thickness of the drift layer for providing a withstanding voltage is small, the resistance in the drift layer does not increase as the temperature increases. Furthermore, the on-voltage in the requirement current in the vicinity of the operational temperature is lowered as the temperature increases.

DETAILED DESCRIPTION

In a rectifier device using an SiC semiconductor, if a plurality of diodes are used in parallel within a circuit, and an electric current is concentrated on a certain device, the temperature in that device increases, and the resistance is further reduced. Accordingly, the current concentration is further expedited, and finally, may generate thermal breakdown. An embodiment has been made to address such a problem, and provides a semiconductor device of which the resistance increases as the device temperature increases.

The semiconductor rectifier device according to the embodiment is a rectifier device using a SiC semiconductor.

This rectifier device may include an anode electrode; an anode area that adjoins the anode electrode and is made of a second conductivity type semiconductor; a drift layer that adjoins the anode area and is made of a first conductivity type semiconductor having a low concentration; a minority carrier absorption layer that adjoins the drift layer and is made of a first conductivity type semiconductor having a higher concentration than that of the drift layer; a high-resistance semiconductor layer that adjoins the minority carrier absorption layer, has less thickness than the drift layer and is made of a first conductivity type semiconductor having a concentration lower than that of the minority carrier absorption layer; a cathode contact layer that adjoins the high-resistance semiconductor layer and is made of a first conductivity type semiconductor layer having a high concentration; and a cathode electrode adjoining the cathode contact layer.

[First Embodiment: Device]

Hereinafter, description will be made with reference to FIG. 1, which is a schematic cross-sectional view illustrating a PiN diode device as a semiconductor rectifier device according to the embodiment.

Figure 1:
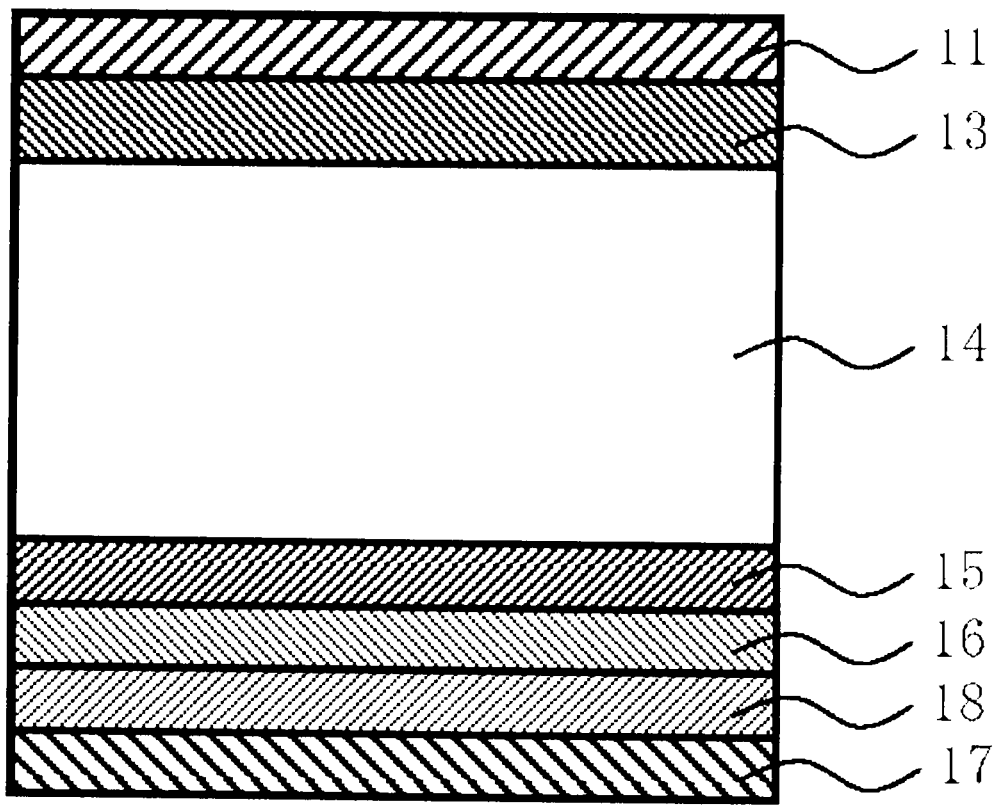
FIG. 1 is a schematic cross-sectional view illustrating a rectifier device according to an embodiment.

As shown in FIG. 1, the PiN diode device according to an embodiment at least includes: an anode electrode 11; an anode area 13 that adjoins the anode electrode and is made of a second conductivity type semiconductor; a drift layer 14 that adjoins the anode area and is made of a first conductivity type semiconductor having a low concentration; a minority carrier absorption layer 15 that adjoins the drift layer and is made of a first conductivity type semiconductor having a higher concentration than that of the drift layer; a high-resistance semiconductor layer 16 that adjoins the minority carrier absorption layer and is made of a first conductivity type semiconductor having a concentration lower than that of the minority carrier absorption layer; a cathode contact layer 18 that adjoins the high-resistance semiconductor layer and is made of a first conductivity type semiconductor having a high concentration; and a cathode electrode 17 adjoining the cathode contact layer.

As the semiconductor contained in the PiN diode device, SiC may be used. As a doping impurity of SiC, nitrogen, aluminum, boron, and phosphorus may be used. The SiC with the doped nitrogen or phosphorus has an n-type conductivity, and the SiC with the doped aluminum or boron has a p-type conductivity.

(Anode Area)

The anode area 13 is a p+ layer obtained by doping aluminum or boron onto SiC, and preferably has an impurity concentration of, for example, $5E^{+17}$ cm$^{-3}$ to $1E^{+18}$ cm$^{-3}$. For example, it has a layer thickness of about 1.5 μm.

Figure 7:
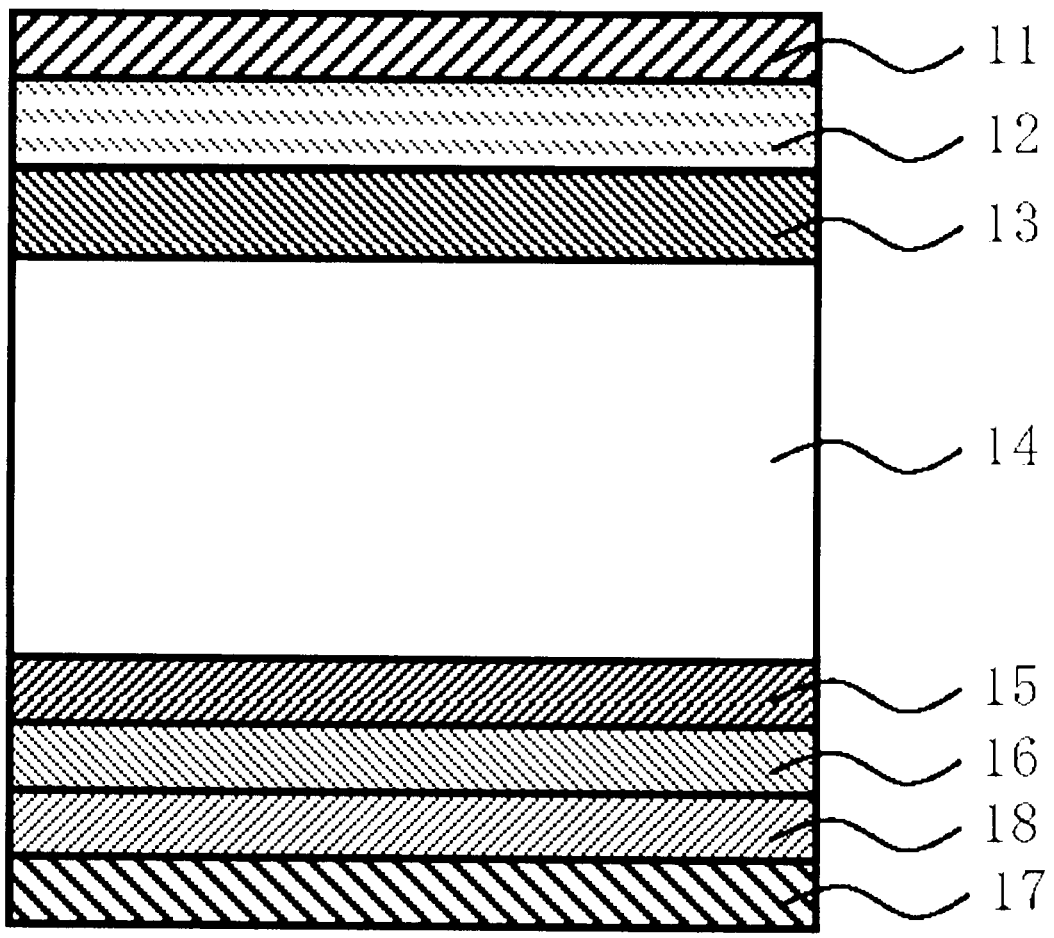
FIG. 7 is a schematic cross-sectional view illustrating a rectifier device according to another embodiment.

If the junction between the anode area 13 and the anode electrode 11 is not an ohmic contact, it is preferable that an anode contact area made of a high-concentration p$^{++}$ semiconductor be interposed between the anode area and the anode electrode as shown in FIG. 7 which is a schematic cross-sectional view illustrating the semiconductor rectifier device according to another embodiment.

(Anode Contact Area)

The anode contact area 12 is a p$^{++}$ layer formed by doping aluminum or boron onto SiC and preferably has an impurity concentration of $1E^{+19}$ cm$^{-3}$ or higher.

The anode contact area 12 preferably has a layer thickness of 1 nm or larger. If the layer thickness is smaller than this value, the electrode material is diffused through a contact sintering process with the electrode, and reaches the p$^+$ area. As a result, it is difficult to provide a p$^{++}$ interface, and the contact resistance disadvantageously increases.

(Drift Layer)

The drift layer 14 is an n$^-$ SiC layer where nitrogen is doped as an impurity. A desired withstanding voltage of the rectifier device is controlled by controlling the thickness and the impurity concentration of the drift layer. It is necessary to reduce the concentration and increase the thickness in order to obtain a high withstanding voltage, whereas it is necessary to increase the impurity concentration and reduce the thickness in order to obtain a low withstanding voltage. In order to obtain a device having a withstanding voltage of about 5 kV, the impurity concentration is set to, for example, $1.2E^{+15}$ cm$^{-3}$, and the thickness is set to, for example, 36 μm.

(Minority Carrier Absorption Layer)

The aforementioned minority carrier absorption layer 15 is provided to recombine the holes injected from the anode to prevent diffusion into the high-resistance semiconductor layer 16. As a result, the conductivity change of the high-resistance semiconductor layer 16 is suppressed.

In the present embodiment, it is important to control the impurity concentration and the thickness of the minority carrier absorption layer 15 at a predetermined range. As described below, as a result of simulation, it is recognized that a relation between the impurity concentration and the thickness of the minority carrier absorption layer is preferably selected from a range expressed as the following general equation.

$$D_r \geq = 4E^{+20} E^{-d_r}$$ [Equation 1]

In Equation 1, $D_r$ denotes the impurity concentration (cm$^{-3}$), and dr denotes the thickness (μm) of the minority carrier layer. The impurity concentration and the thickness of the minority carrier layer are selected from a range satisfying Equation 1 described above. If each of the values does not satisfy the aforementioned equation, carrier absorption is not sufficiently generated. As a result, the temperature coefficient of the entire rectifier device becomes negative, and the resistance value is reduced as the temperature increases so that the device breakdown may occur.

(High-Resistance Semiconductor Layer)

The high-resistance semiconductor layer 16 is an n$^-$ semiconductor layer containing SiC, poly-silicon, and the like, and is an area for carrying out unipolar operation as a PiN diode. In the high-resistance semiconductor layer 16, the temperature of the rectifier device according to the present embodiment increases, and the resistance increases due to phonon scattering, so that the temperature coefficient of the resistance of the entire rectifier device becomes "positive".

Similar to the aforementioned minority carrier absorption layer, as a result of simulation described below, it is recognized that a relation between the thickness and the impurity concentration of the phonon scattering layer can be expressed as the following Equation 2.

$$D_c = <5E^{+15} \times d_c$$ [Equation 2]

In Equation 2, $D_c$ denotes an impurity concentration (cm$^{-3}$) of the high-resistance semiconductor layer, and $d_c$ denotes the thickness (μm) of the high-resistance semiconductor layer.

The values of Dc and dc are selected from a range satisfying the aforementioned equation. If the values of Dc and dc do not satisfy the aforementioned equation, it is not possible to set the temperature coefficient of the entire device to a positive value.

It is more preferable that the impurity concentration of the high-resistance semiconductor layer is determined within the rage defined by Equation 3 shown below.

$$D_{c v} = <y E^{+14} \times d_c + 2E^{+15}$$ [Equation 3]

In Equation 3, $D_{c2}$ denotes an impurity concentration (cm$^{-3}$) of the high-resistance semiconductor layer, and $d_c$ denotes the thickness (μm) of the high-resistance semiconductor layer.

If the impurity concentration of high-resistance semiconductor layer is controlled within this range, the device can be a positive temperature coefficient of the entire element in the operating area of about 300 A/cm$^2$. The current flowing into the device to suppress the concentration of current density, it is possible to avoid the destruction of the device.

It is necessary that the thickness of the high-resistance semiconductor layer is less than the thickness of the drift layer. If the thickness of the high-resistance layer is more than the thickness of the drift layer, a cross-point is expressed in the region of high voltage of I-V characteristic graph. This means that the resistance of the device increase. Therefore this is not preferable because the loss will increase (Cathode Contact Layer)

In a case where an ohmic contact is not provided between the high-resistance semiconductor layer and the cathode electrode, the cathode contact layer 18 is interposed between the cathode electrode 17 and the high-resistance semiconductor layer 16 so that an ohmic contact can be provided.

It is preferable that the cathode contact layer be an n$^{++}$ SiC semiconductor layer.

(Anode electrode and Cathode electrode)

It is possible to obtain contact by using a metal material mainly containing Al in the anode electrode and by using a metal material mainly containing Ni and the like in the cathode electrode.

[Simulation] (Selection of Layer Thickness and Impurity Concentration in Minority Carrier Absorption Layer)

Figure 2:
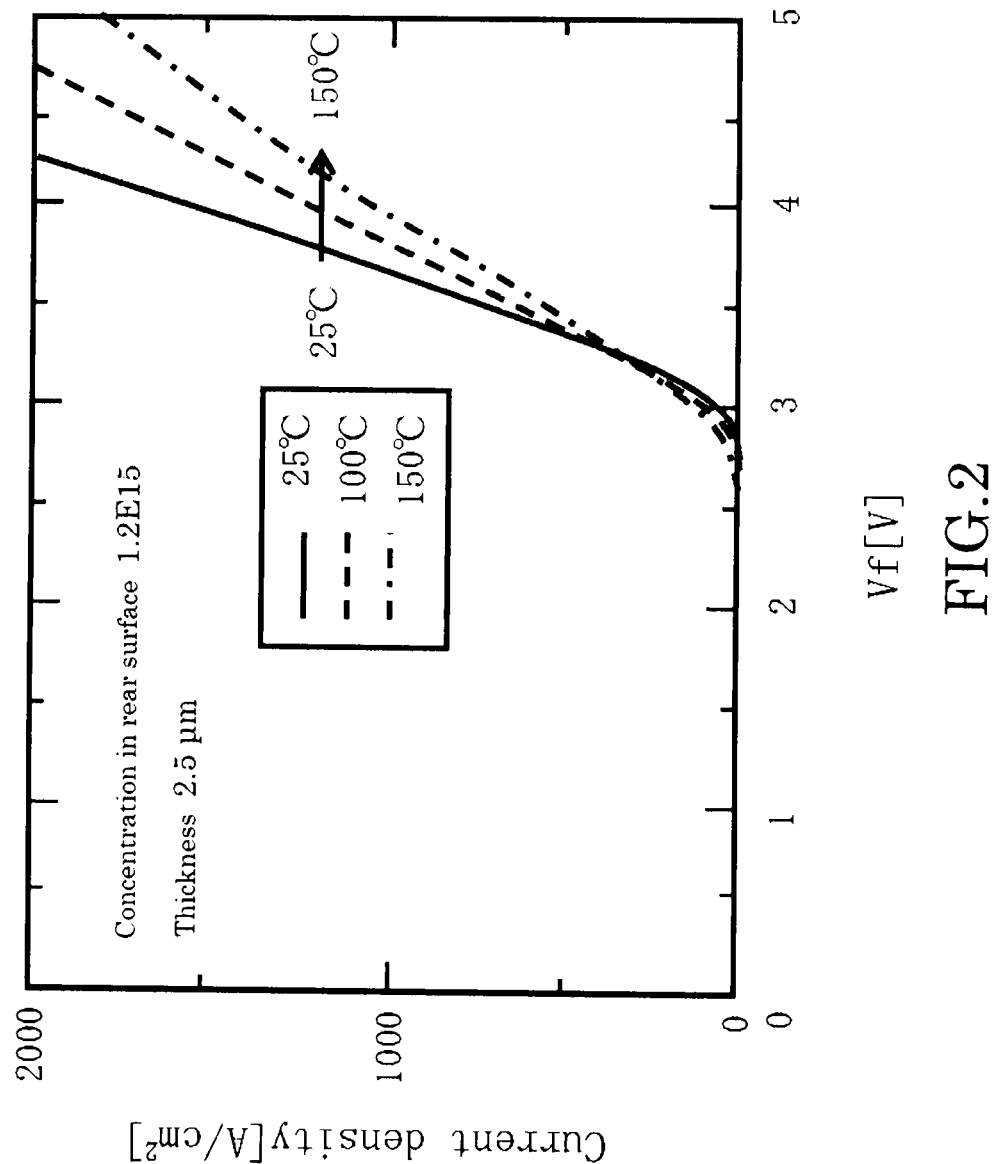
FIG. 2 is a graph illustrating an I-V characteristic of the rectifier device according to an embodiment.
Figure 3:
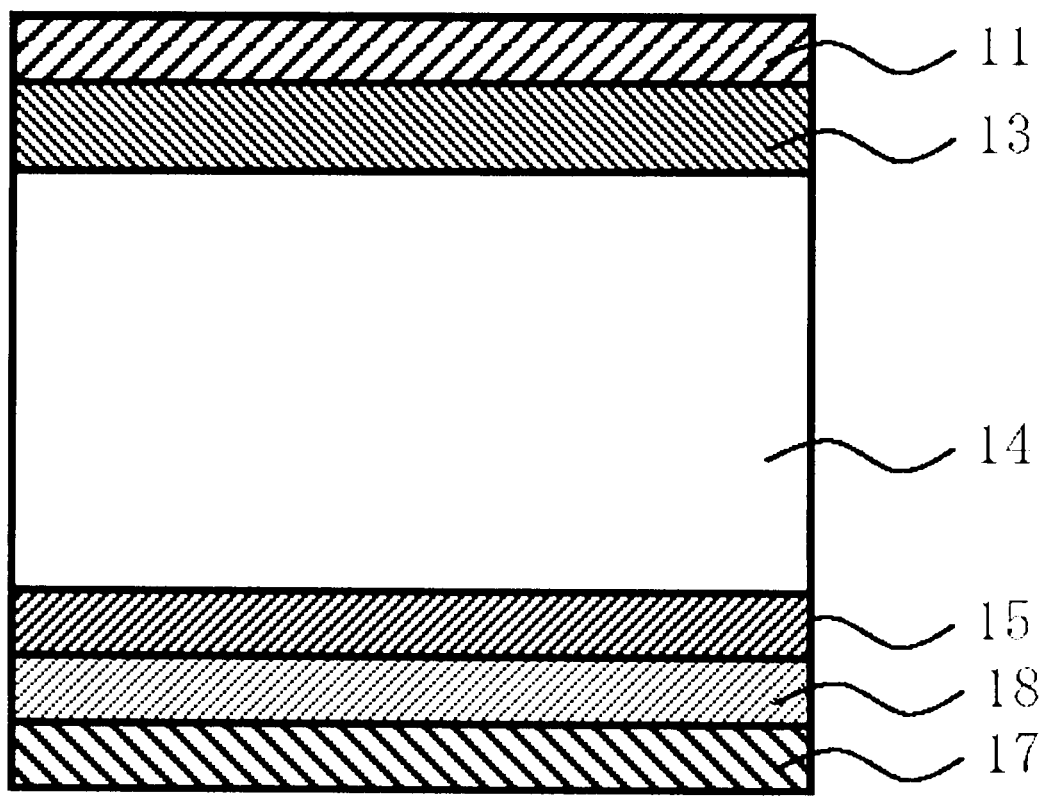
FIG. 3 is a schematic cross-sectional view illustrating a rectifier device of the related art.
Figure 4:
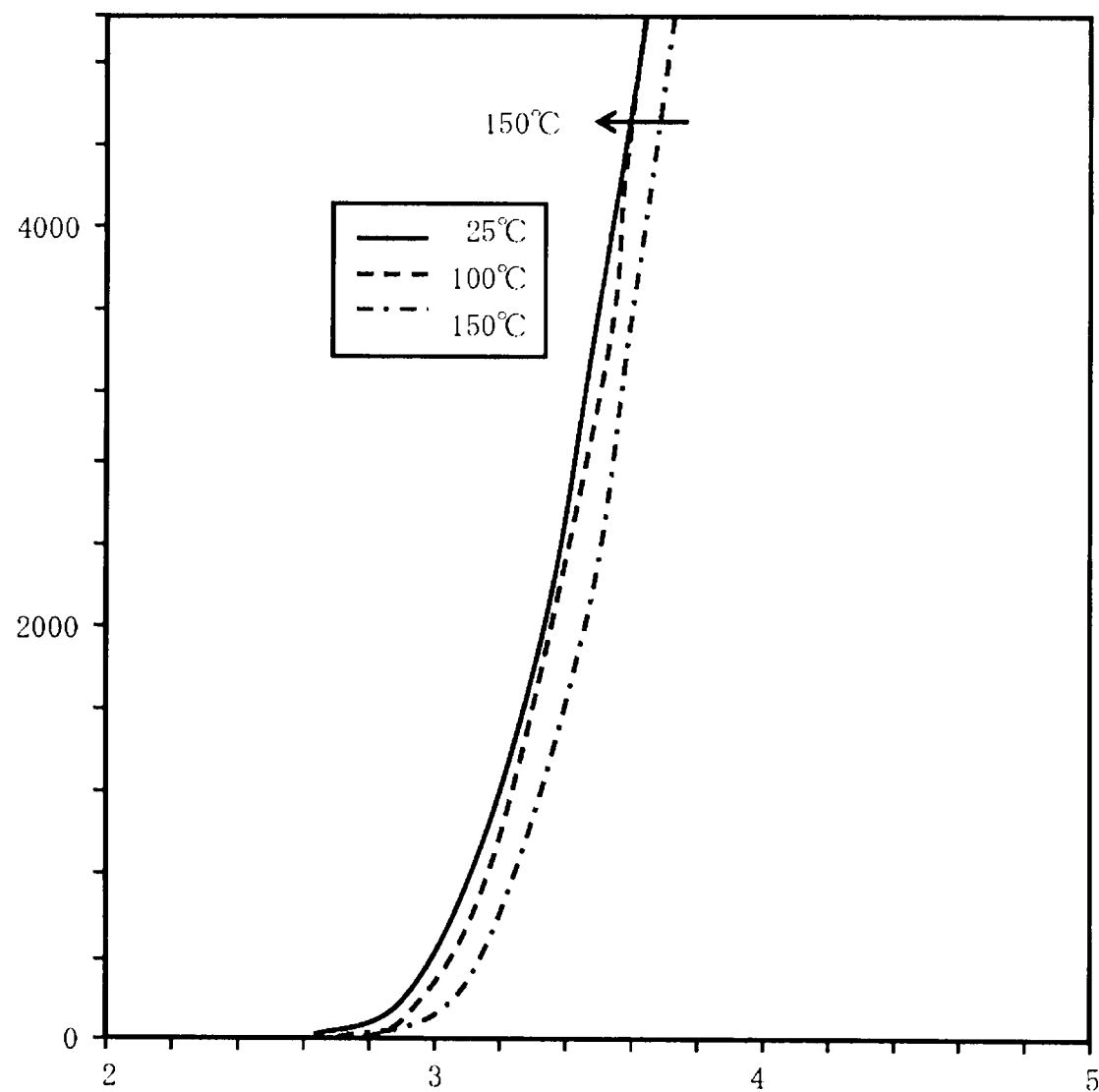
FIG. 4 is a graph illustrating an I-V characteristic of the rectifier device of the related art.

Investigation was performed by simulating an I-V curve for the thickness and the impurity concentration of the minority carrier absorption layer by changing the device temperature in the rectifier device according to an embodiment as shown in FIG. 7 and the rectifier device of the related art as shown in FIG. 3. The result is shown in FIGS. 2 and 4.

The rectifier device of FIG. 1 according to an embodiment has a layer structure as shown in Table 1.

TABLE 1

| | conductivity type | Impurity concentration [cm$^{-3}$] | Thickness(μm) |
|---|---|---|---|
| Anode Contact Area | p$^{++}$ | 1E$^{+19}$ | 0.5 |
| Anode Area | p$^{+}$ | 8E$^{+17}$ | 1.5 |
| Drift Layer | n$^{-}$ | 1.2E$^{-15}$ | 36 |
| SiC Substrate (Minority Carrier Absorption Layer) | n$^{+}$ | | |
| High-resistance Semiconductor Layer | n$^{-}$ | 1.2E$^{15}$ | 2.5 |
| Cathode Contact Layer | n$^{++}$ | | |

The I-V curve of this semiconductor rectifier device is illustrated in FIG. 2.

Referring to the I-V curve of FIG. 2, the resistance in the forward direction increases as the temperature increases. It is apparent that, from the vicinity of the anticipated electric current density 300 A/cm$^2$, the voltage in the forward direction is reversed, and the temperature coefficient becomes positive.

Meanwhile, the semiconductor rectifier device of FIG. 3 was prepared. The configuration thereof is shown in Table 2.

TABLE 2

| | conductivity type | Impurity concentration [cm$^{-3}$] | Thickness(μm) |
|---|---|---|---|
| Anode Contact Area | p$^{++}$ | 1E$^{+19}$ | 0.5 |
| Anode Area | p$^{+}$ | 8E$^{+17}$ | 1.5 |
| Drift Layer | n$^{-}$ | 1.2E$^{-15}$ | 36 |
| SiC Substrate (Cathode Contact Layer) | n$^{+}$ | | |

The I-V curve of this semiconductor rectifier device is illustrated in FIG. 4.

As apparent from FIG. 4, in the rectifier device of the related art, as the device temperature increases, the resistance in the forward direction is reduced so that the temperature coefficient becomes negative.

Figure 5:
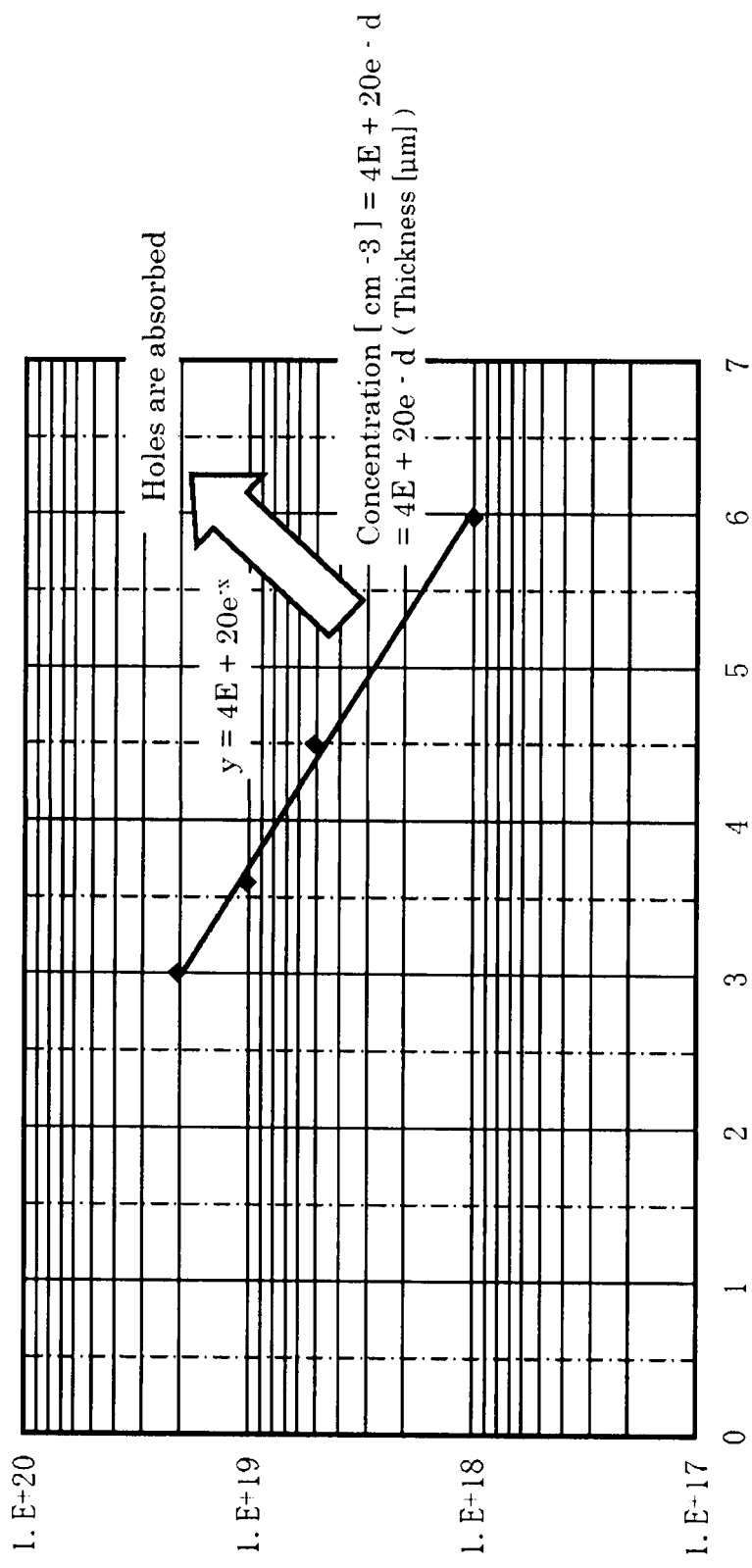
FIG. 5 is a graph illustrating a minority carrier absorption relation against the impurity concentration and the thickness of the minority carrier absorption layer.

Next, the change of the I-V curve was simulated by variously changing the impurity concentration and the thickness of the minority carrier absorption layer. The result is shown in FIG. 5. Referring to FIG. 5, holes are absorbed in the upper right area with respect to the line segment A-A, whereas holes are not absorbed in the lower left area. Therefore, it was recognized that it is necessary to control the impurity concentration and the thickness at a range satisfying Equation 1 from the line segment A-A.

$$D_r \geq = 4E^{+20} E^{-d_r}$$ [Equation 1]

where, Dr denotes the impurity concentration (cm$^{-3}$), and dr denotes the thickness (μm) of the minority carrier layer.

(Selection of Impurity Concentration and Layer Thickness in High-Resistance Semiconductor Layer)

Next, the change of the I-V curve was simulated by variously changing the impurity concentration and the thickness of the high-resistance semiconductor layer. The result is illustrated in FIG. 6.

Figure 6:
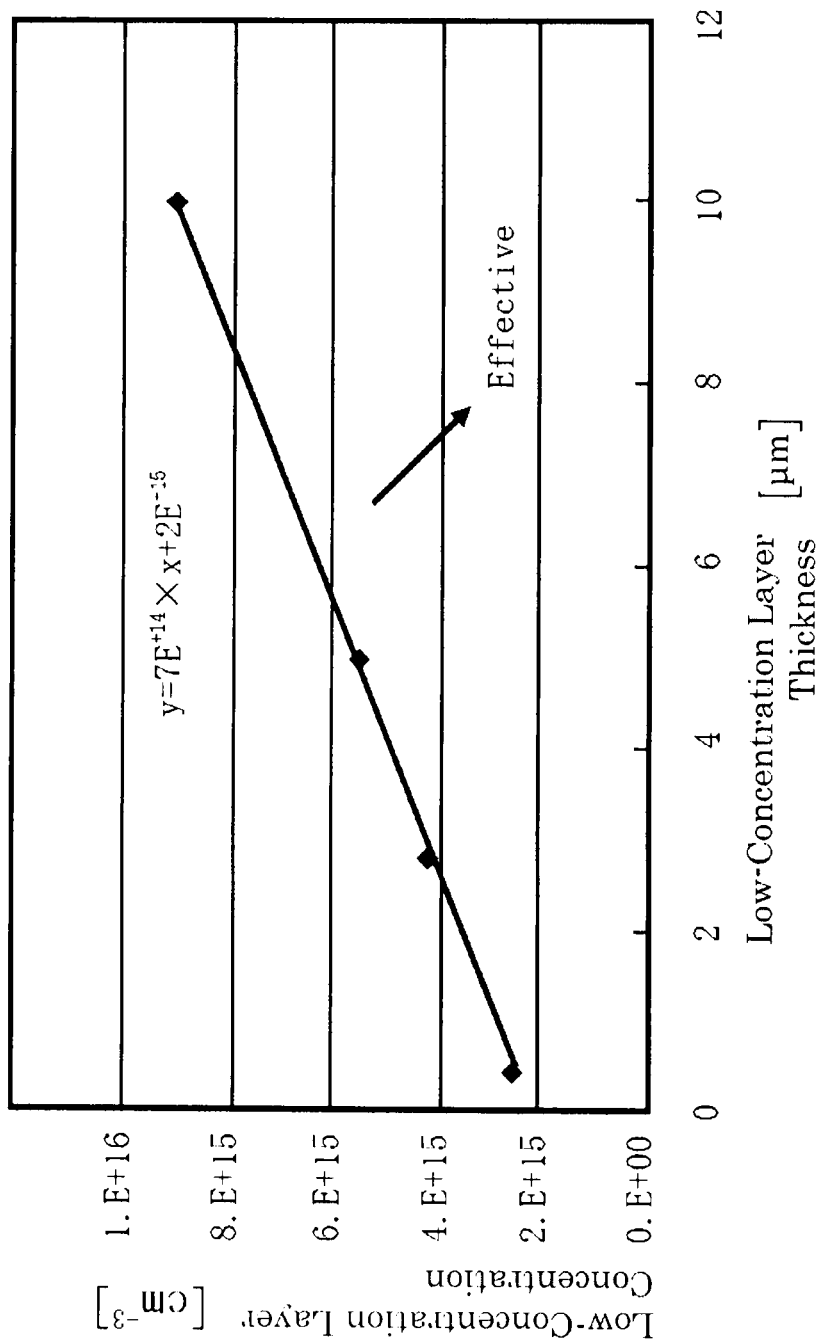
FIG. 6 is a graph illustrating a relation of phonon scattering against the impurity concentration and the thickness of the high-resistance semiconductor layer.

As shown in FIG. 6, if the impurity concentration and the thickness of the high-resistance semiconductor layer satisfy the relation shown in Equation 2, the temperature coefficient of the resistance can be positive. Therefore, it was recognized that it is necessary to perform control such that the impurity concentration and the thickness satisfy this relation.

$$D_{c2} = <7E^{+14} \times d_c + 2E^{+15}$$ [Equation 3]

where, Dc denotes an impurity concentration (cm$^{-3}$) of the high-resistance semiconductor layer, and dc denotes the thickness (μm) of the high-resistance semiconductor layer.

(Second Embodiment: Method of Manufacturing Devices)

According to the aforementioned embodiment, the semiconductor rectifier device illustrated in FIG. 1 can be manufactured using the following process.

(1) A high-resistance semiconductor layer 16 is formed on a surface of the n$^{+}$ SiC substrate 18. The epitaxial growth technique and the ion implantation technique may also be employed to form this layer. (2) Then, a minority carrier absorption layer 15 is formed on the surface of the high-resistance semiconductor layer 16 through an epitaxial growth technique, ion implantation technique and the like.

(3) Then, a n$^{-}$ drift layer 14 is formed on the surface of the minority carrier absorption layer 15 through an epitaxial growth technique, ion implantation technique and the like.

(4) A SiC anode area 13 is formed on the surface of the drift layer 14 through an epitaxial growth technique and the like, and a layer having a desired impurity concentration is obtained through ion implantation. If necessary, an anode contact layer is formed.

(5) Then, a mesa structure is formed by remove a part of the anode area 13 through a reactive ion etching technique and the like, or a resurf structure is formed through ion implantation, and the like, so that a typical voltage withstanding structure is formed.

(6) An annealing process is carried out to activate the injected impurities.

(7) An anode electrode 11 is formed on the surface of the anode area through sputtering and the like.

Through the aforementioned processes, the rectifier device according to the aforementioned embodiment can be manufactured.

(Third Embodiment: Method of Manufacturing Devices)

The semiconductor rectifier device according to an embodiment can be manufactured using the following process.

(1) A n$^{-}$ drift layer is formed on the surface of the SiC substrate through an epitaxial growth technique and the like.

(2) A SiC anode area is formed on an entire or partial surface of the drift layer through an epitaxial growth technique, ion implantation technique and the like, and a layer having a desired impurity concentration is obtained through ion implantation. If necessary, an anode contact layer is formed.

(3) Then, a mesa structure is formed by remove a part of the anode area through a reactive ion etching technique and the like, or a resurf structure is formed through ion implantation, and the like, so that a typical voltage withstanding structure is formed.

(4) An annealing process is carried out to activate the injected impurities.

(5) An anode electrode is formed on the surface of the anode area through sputtering and the like.

(6) A high-resistance semiconductor layer is formed on a rear surface of the SiC substrate. The epitaxial growth technique and the ion implantation technique may also be employed to form this layer.

(7) A high-concentration cathode contact layer is formed on the surface of the high-resistance semiconductor layer.

(8) A cathode electrode is formed on the cathode contact layer through sputtering and the like.

In this process, by a rear surface of the SiC substrate is thinned with grind, CMP, or horning, a forward characteristics can be improved further. Through the aforementioned processes, the rectifier device according to the present embodiment can be manufactured.

Although the SiC semiconductor substrate is used as an area corresponding to the carrier absorption layer in the aforementioned embodiment, a low-concentration SiC epitaxial layer formed on the SiC substrate as a high-resistance semiconductor layer may be used. In the aforementioned embodiment, it is necessary that each layer under the drift layer is formed on the surface of the semiconductor substrate, and the high-resistance semiconductor layer is formed on the rear surface of the SiC semiconductor substrate, so that the manufacturing process becomes complicated. However, a low-concentration n-type SiC epitaxial layer may be formed on the SiC semiconductor substrate to increase the resistance and also to increase the device temperature, and a high-concentration n-type epitaxial layer may be formed on the low-concentration n-type epitaxial layer to act to absorb minority carriers in this layer. In addition, a drift layer and an anode layer may be formed thereon. Since each layer excluding the cathode electrode is formed on the surface of the SiC semiconductor substrate, it is possible to improve work efficiency. In this case, while the SiC semiconductor substrate serves as a high-concentration n-type SiC area to make ohmic contact with the cathode electrode, a high-concentration n-type impurity area may be further provided in the cathode electrode interface as necessary.

Although several embodiments have been described hereinbefore, those embodiments are just for exemplary purposes and are not intended to limit the scope of the invention. Those novel embodiments may be embodied in various other forms, and various omissions, substitutions, or changes may be made without departing from the spirit and scope of the invention. Such embodiments and modifications thereof are to be construed in the broadest sense within the spirit or scope of the invention, and incorporated into the invention disclosed in the claims and equivalents thereof.

While certain embodiments have been described, these embodiments have been presented by way of example only, and are note intended to limit the scope of the inventions. Indeed, the novel devices described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor rectifier device comprising:
an anode electrode;
an anode area that adjoins the anode electrode and is made of a second conductivity type semiconductor;
a drift layer that adjoins the anode area and is made of a low-concentration first conductivity type semiconductor;
a minority carrier absorption layer that adjoins the drift layer and is made of a first conductivity type semiconductor having a concentration higher than that of the drift layer;
a high-resistance semiconductor layer that adjoins the minority carrier absorption layer, has less thickness than the drift layer and is made of a first conductivity type semiconductor having a concentration lower than that of the minority carrier absorption layer;
a cathode contact layer that adjoins the high-resistance semiconductor layer and is made of a first conductivity type semiconductor having a concentration higher than the high-resistance semiconductor layer; and
a cathode electrode adjoining the cathode contact layer,
wherein a relation between a concentration of an impurity and a thickness of the minority carrier absorption layer is set to a range satisfying the following Equation 1

$$D_r \geq 4E^{+20}E^{-d_r} \qquad \text{[Equation 1]}$$

where, Dr denotes the concentration (cm$^{-3}$) of an impurity, and dr denotes the thickness (μm) of the minority carrier layer.

2. The semiconductor rectifier device according to claim 1, wherein the semiconductor comprises SiC.

3. The semiconductor rectifier device according to claim 1, wherein the minority carrier absorption layer acts to recombine holes injected from the anode, and the high-resistance semiconductor layer acts to prevent conductivity change.

4. The semiconductor rectifier device according to claim 1, wherein the high-resistance semiconductor layer is activated in an area where an unipolar operation is carried out, to increase a resistance as a device temperature increases due to phonon scattering so that a temperature coefficient of the resistance in the entire device becomes positive.

5. A semiconductor rectification apparatus comprising a plurality of semiconductor rectifier devices connected in parallel, each of the semiconductor rectifier device including:
an anode electrode;
an anode area that adjoins the anode electrode and is made of a second conductivity type semiconductor;
a drift layer that adjoins the anode area and is made of a low-concentration first conductivity type semiconductor;
a minority carrier absorption layer that adjoins the drift layer and is made of a first conductivity type semiconductor having a concentration higher than that of the drift layer;
a high-resistance semiconductor layer that adjoins the minority carrier absorption layer, has less thickness than the drift layer and is made of a first conductivity type semiconductor having a concentration lower than that of the minority carrier absorption layer;
a cathode contact layer that adjoins the high-resistance semiconductor layer; and
a cathode electrode adjoining the cathode contact layer,
wherein a relation between a concentration of an impurity and a thickness of the minority carrier absorption layer is set to a range satisfying the following Equation 1

$$D_r \geq 4E^{+20}E^{-d_r} \qquad \text{[Equation 1]}$$

where, Dr denotes the concentration (cm−3) of an impurity, and dr denotes the thickness (μm) of the minority carrier layer.

6. The semiconductor rectifier device according to claim 5, wherein the semiconductor comprises SiC.

7. The semiconductor rectifier device according to claim 5, wherein the minority carrier absorption layer acts to recombine holes injected from the anode, and the high-resistance semiconductor layer acts to prevent conductivity change.

8. The semiconductor rectifier device according to claim 5, wherein the high-resistance semiconductor layer is activated in an area where an unipolar operation is carried out, to increase a resistance as a device temperature increases due to phonon scattering so that a temperature coefficient of the resistance in the entire device becomes positive.

9. A semiconductor rectifier device comprising:
an anode electrode;
an anode area that adjoins the anode electrode and is made of a second conductivity type semiconductor;
a drift layer that adjoins the anode area and is made of a low-concentration first conductivity type semiconductor;
a minority carrier absorption layer that adjoins the drift layer and is made of a first conductivity type semiconductor having a concentration higher than that of the drift layer;
a high-resistance semiconductor layer that adjoins the minority carrier absorption layer, has less thickness than the drift layer and is made of a first conductivity type semiconductor having a concentration lower than that of the minority carrier absorption layer;
a cathode contact layer that adjoins the high-resistance semiconductor layer and is made of a first conductivity type semiconductor having a concentration higher than the high-resistance semiconductor layer; and
a cathode electrode adjoining the cathode contact layer,
wherein a relation between a concentration of an impurity and a thickness of the high-resistance semiconductor layer is set to a range satisfying the following Equation 2

$$D_c = <5E^{+15}xd_c \qquad [\text{Equation 2}]$$

where, Dc denotes the concentration ($cm^{-3}$) of an impurity of the high-resistance semiconductor layer, and dc denotes the thickness (μm) of the high-resistance semiconductor layer.

10. The semiconductor rectifier device according to claim 9, wherein the semiconductor comprises SiC.

11. The semiconductor rectifier device according to claim 9, wherein the minority carrier absorption layer acts to recombine holes injected from the anode, and the high-resistance semiconductor layer acts to prevent conductivity change.

12. The semiconductor rectifier device according to claim 9, wherein the high-resistance semiconductor layer is activated in an area where an unipolar operation is carried out, to increase a resistance as a device temperature increases due to phonon scattering so that a temperature coefficient of the resistance in the entire device becomes positive.

13. A semiconductor rectifier device comprising:
an anode electrode;
an anode area that adjoins the anode electrode and is made of a second conductivity type semiconductor;
a drift layer that adjoins the anode area and is made of a low-concentration first conductivity type semiconductor;
a minority carrier absorption layer that adjoins the drift layer and is made of a first conductivity type semiconductor having a concentration higher than that of the drift layer;
a high-resistance semiconductor layer that adjoins the minority carrier absorption layer, has less thickness than the drift layer and is made of a first conductivity type semiconductor having a concentration lower than that of the minority carrier absorption layer;
a cathode contact layer that adjoins the high-resistance semiconductor layer and is made of a first conductivity type semiconductor having a concentration higher than the high-resistance semiconductor layer; and
a cathode electrode adjoining the cathode contact layer,
wherein the impurity concentration of the high-resistance layer is set to a range satisfying the following Equation 3

$$D_{c2} = <7E^{+14}xd_c + 2E^{+15} \qquad [\text{Equation 3}]$$

where, $D_{c2}$ denotes the concentration ($cm^{-3}$) of an impurity of the high-resistance semiconductor layer, and dc denotes the thickness (μm) of the high-resistance semiconductor layer.

14. The semiconductor rectifier device according to claim 13, wherein the semiconductor comprises SiC.

15. The semiconductor rectifier device according to claim 13, wherein the minority carrier absorption layer acts to recombine holes injected from the anode, and the high-resistance semiconductor layer acts to prevent conductivity change.

16. The semiconductor rectifier device according to claim 13, wherein the high-resistance semiconductor layer is activated in an area where an unipolar operation is carried out, to increase a resistance as a device temperature increases due to phonon scattering so that a temperature coefficient of the resistance in the entire device becomes positive.

17. A semiconductor rectification apparatus comprising a plurality of semiconductor rectifier devices connected in parallel, each of the semiconductor rectifier device including:
an anode electrode;
an anode area that adjoins the anode electrode and is made of a second conductivity type semiconductor;
a drift layer that adjoins the anode area and is made of a low-concentration first conductivity type semiconductor;
a minority carrier absorption layer that adjoins the drift layer and is made of a first conductivity type semiconductor having a concentration higher than that of the drift layer;
a high-resistance semiconductor layer that adjoins the minority carrier absorption layer, has less thickness than the drift layer and is made of a first conductivity type semiconductor having a concentration lower than that of the minority carrier absorption layer;
a cathode contact layer that adjoins the high-resistance semiconductor layer; and
a cathode electrode adjoining the cathode contact layer,
wherein a relation between a concentration of an impurity and a thickness of the high-resistance semiconductor layer is set to a range satisfying the following Equation 2

$$D_c = <5E^{+15}xd_c \qquad [\text{Equation 2}]$$

where, Dc denotes the concentration ($cm^{-3}$) of an impurity of the high-resistance semiconductor layer, and dc denotes the thickness (μm) of the high-resistance semiconductor layer.

18. The semiconductor rectifier device according to claim 17, wherein the semiconductor comprises SiC.

19. The semiconductor rectifier device according to claim 17, wherein the minority carrier absorption layer acts to recombine holes injected from the anode, and the high-resistance semiconductor layer acts to prevent conductivity change.

20. The semiconductor rectifier device according to claim 17, wherein the high-resistance semiconductor layer is activated in an area where an unipolar operation is carried out, to increase a resistance as a device temperature increases due to phonon scattering so that a temperature coefficient of the resistance in the entire device becomes positive.

21. A semiconductor rectification apparatus comprising a plurality of semiconductor rectifier devices connected in parallel, each of the semiconductor rectifier device including:
   an anode electrode;
   an anode area that adjoins the anode electrode and is made of a second conductivity type semiconductor;
   a drift layer that adjoins the anode area and is made of a low-concentration first conductivity type semiconductor;
   a minority carrier absorption layer that adjoins the drift layer and is made of a first conductivity type semiconductor having a concentration higher than that of the drift layer;
   a high-resistance semiconductor layer that adjoins the minority carrier absorption layer, has less thickness than the drift layer and is made of a first conductivity type semiconductor having a concentration lower than that of the minority carrier absorption layer;
   a cathode contact layer that adjoins the high-resistance semiconductor layer; and
   a cathode electrode adjoining the cathode contact layer,
   wherein the impurity concentration of the high-resistance layer is set to a range satisfying the following Equation 3

$$D_{c2} =< 7E^{+14} x d_c + 2E^{+15} \qquad \text{[Equation 3]}$$

where, $D_{c2}$ denotes the concentration ($cm^{-3}$) of an impurity of the high-resistance semiconductor layer, and de denotes the thickness ($\mu m$) of the high-resistance semiconductor layer.

22. The semiconductor rectifier device according to claim 21, wherein the semiconductor comprises SiC.

23. The semiconductor rectifier device according to claim 21, wherein the minority carrier absorption layer acts to recombine holes injected from the anode, and the high-resistance semiconductor layer acts to prevent conductivity change.

24. The semiconductor rectifier device according to claim 21, wherein the high-resistance semiconductor layer is activated in an area where an unipolar operation is carried out, to increase a resistance as a device temperature increases due to phonon scattering so that a temperature coefficient of the resistance in the entire device becomes positive.

* * * * *